United States Patent
Asai et al.

(10) Patent No.: US 6,723,448 B2
(45) Date of Patent: Apr. 20, 2004

(54) METHOD OF MANUFACTURING HONEYCOMB EXTRUSION DIE AND DIE MANUFACTURED ACCORDING TO THIS METHOD

(75) Inventors: Yuji Asai, Nagoya (JP); Makoto Furutani, Komaki (JP); Keiji Matsumoto, Nagoya (JP)

(73) Assignee: NGK Insulators, Ltd. (JP)

( * ) Notice: Subject to any disclaimer, the term of this patent is extended or adjusted under 35 U.S.C. 154(b) by 12 days.

(21) Appl. No.: 10/058,063

(22) Filed: Jan. 29, 2002

(65) Prior Publication Data

US 2002/0152603 A1 Oct. 24, 2002

(30) Foreign Application Priority Data

Jan. 29, 2001 (JP) ......... 2001-019702

(51) Int. Cl.[7] ............ H01F 3/06; B29C 45/00; C23C 28/02
(52) U.S. Cl. ............ 428/544; 428/596; 428/542.8; 425/542; 205/192
(58) Field of Search ............ 205/192; 425/542; 428/544, 596, 542.8

(56) References Cited

U.S. PATENT DOCUMENTS

| | | | |
|---|---|---|---|
| 3,656,995 A | 4/1972 | Reedy, Jr. | 117/69 |
| 4,574,459 A | 3/1986 | Peters | 29/527.4 |
| 5,075,181 A * | 12/1991 | Quinto et al. | 428/698 |
| 5,702,659 A * | 12/1997 | Kragle et al. | 264/177.11 |
| 6,193,497 B1 * | 2/2001 | Suzuki | 425/380 |

FOREIGN PATENT DOCUMENTS

| | | | | |
|---|---|---|---|---|
| DE | 19810076 A1 * | 10/1998 | | B28B/3/26 |
| JP | 59 193713 A | 11/1984 | | |
| JP | 60-145804 | 8/1985 | | |
| JP | 06 264213 A | 9/1994 | | |
| JP | 10-309713 | 11/1998 | | |
| JP | 2000-246330 | 9/2000 | | |

* cited by examiner

*Primary Examiner*—Edna Wong
(74) *Attorney, Agent, or Firm*—Parkhurst & Wendel, L.L.P.

(57) ABSTRACT

A method of manufacturing a honeycomb extrusion die has the steps of: preparing a die base metal in which a plurality of intersecting slits are arranged in a front surface thereof and a plurality of raw material feeding holes communicated with the slits are arranged in a back surface thereof; forming a plating layer on the die base metal by means of electrolytic plating; (1) and forming a TiCN layer on the plating layer by means of CVD (chemical vapor deposition); or (2) forming a TiN layer on the plating layer by means of CVD (chemical vapor deposition); and forming a TiCN layer on the TiN layer by means of CVD. In this manner, the honeycomb extrusion die is obtained.

5 Claims, 5 Drawing Sheets

TiCN
TiN
Ni
Cell block

TiCN
TiN
Portion showing heavey corrosion
Cell block

METHOD OF MANUFACTURING HONEYCOMB EXTRUSION DIE AND DIE MANUFACTURED ACCORDING TO THIS METHOD

BACKGROUND OF THE INVENTION (1) Field of the Invention

The present invention relates to a method of manufacturing a honeycomb extrusion die used for extruding a ceramic honeycomb structural body and a honeycomb extrusion die manufactured according to this method.

(2) Prior Art Statement

Generally, as a die for extruding a ceramic honeycomb structural body, a honeycomb extrusion die is known in which a plurality of intersecting slits are arranged in a front surface of a die base metal and a plurality of raw material feeding holes communicated with the slits are arranged in a back surface of the die base metal. In such a honeycomb extrusion die, in order to improve a wear resistance of the slits, there is disclosed a technique in JP-A-60-145804 in which at least a part of the die base metals defining the slits is formed by coating iron boride, chromium carbide, aluminum oxide, titanium carbide, titanium nitride or titanium nitride carbide by means of CVD (chemical vapor deposition).

However, in the case that a TiN layer and a TiCN layer are to be formed successively on the die base metal made of for example martensite stainless steel by utilizing the CVD technique, it is known that, if a thickness of the TiN layer or the TiCN layer becomes thicker, a chipping (film peeling off after film formed) is easily generated. This chipping is easily generated particularly at round (R) portions formed by rounding corner portions of the die base metal defining the slits. If the chipping is generated, a coating defect occurs. Therefore, there is a problem such that a productivity of the ceramic honeycomb structural body becomes worse.

On the contrary, the applicant discloses a technique not for eliminating the chipping generation but for narrowing a slit width of the die base metal, in JP-A-10-309713, such that an electroless plating layer made of for example Ni is formed on the die base metal and the TiCN layer and a $W_2C$ layer is formed on the electroless plating layer by means of CVD. However, if this technique is utilized for eliminating the chipping generation, there occurs following problems. That is, P is included in the electroless plating layer made of for example Ni as an impurity. Therefore, if the TiN layer and the TiCN layer are formed on the electroless Ni-P plating layer by CVD, the plating layer and the CVD layer are reacted and it is not possible to obtain normal TiCN particles.

SUMMARY OF THE INVENTION

An object of the present invention is to eliminate the drawbacks mentioned above and to provide a method of manufacturing a honeycomb extrusion die and a die according to this method in which a coating layer with no chipping can be formed on a die base metal and a productivity of a ceramic honeycomb structural body during an extrusion operation can be improved.

According to a first aspect of the invention, a method of manufacturing a honeycomb extrusion die comprises the steps of: preparing a die base metal in which a plurality of intersecting slits are arranged in a front surface thereof and a plurality of raw material feeding holes communicated with the slits are arranged in a back surface thereof; forming a plating layer on the die base metal by means of electrolytic plating; and forming a TiCN layer on the plating layer by means of CVD (chemical vapor deposition).

Moreover, according to a second aspect of the invention, a method of manufacturing a honeycomb extrusion die comprises the steps of: preparing a die base metal in which a plurality of intersecting slits are arranged in a front surface thereof and a plurality of raw material feeding holes communicated with the slits are arranged in a back surface thereof; forming a plating layer on the die base metal by means of electrolytic plating; forming a TiN layer on the plating layer by means of CVD (chemical vapor deposition); and forming a TiCN layer on the TiN layer by means of CVD.

Further, according to the invention, a die manufactured according to the first aspect of the second aspect of the method of manufacturing the honeycomb extrusion die, comprises: (1) a die base metal having slits and raw material feeding holes; a plating layer formed on the die base metal; and a TiCN layer formed on the plating layer, or, (2) a die base metal having slits and raw material feeding holes; a plating layer formed on the die base metal; a TiN layer formed on the plating layer; and a TiCN layer formed on the TiN layer.

In the present invention, since the electrolytic plating layer is arranged between the die base metal and the TiCN layer or between the die base metal and the TiN layer, a contact property therebetween can be improved, so that the chipping is not easily generated if a thickness of the film is thicker. Moreover, since the plating layer is made of the metal and the metal has an excellent stiffness, it is possible to reduce a heat stress between the die base metal and the TiCN layer or the TiN layer, and thus the chipping is not easily generated. Further, since an impurity in the electrolytic plating layer is very little, it is possible to obtain normal TiCN particles.

In the preferred embodiment of the method of manufacturing the honeycomb extrusion die according to the invention, the plating layer is made of Ni, Co, Cu or transition metals which are not easily nitrided or oxidized, and a thickness of the plating layer is not less than 0.01 $\mu$m. In the both embodiments, it is possible to achieve the present invention more effectively, and thus they are preferred.

BRIEF DESCRIPTION OF THE DRAWING

For a better understanding of the present invention, explanations are made to the following drawings wherein.

DESCRIPTION OF THE PREFERRED EMBODIMENTS

Figure 1:
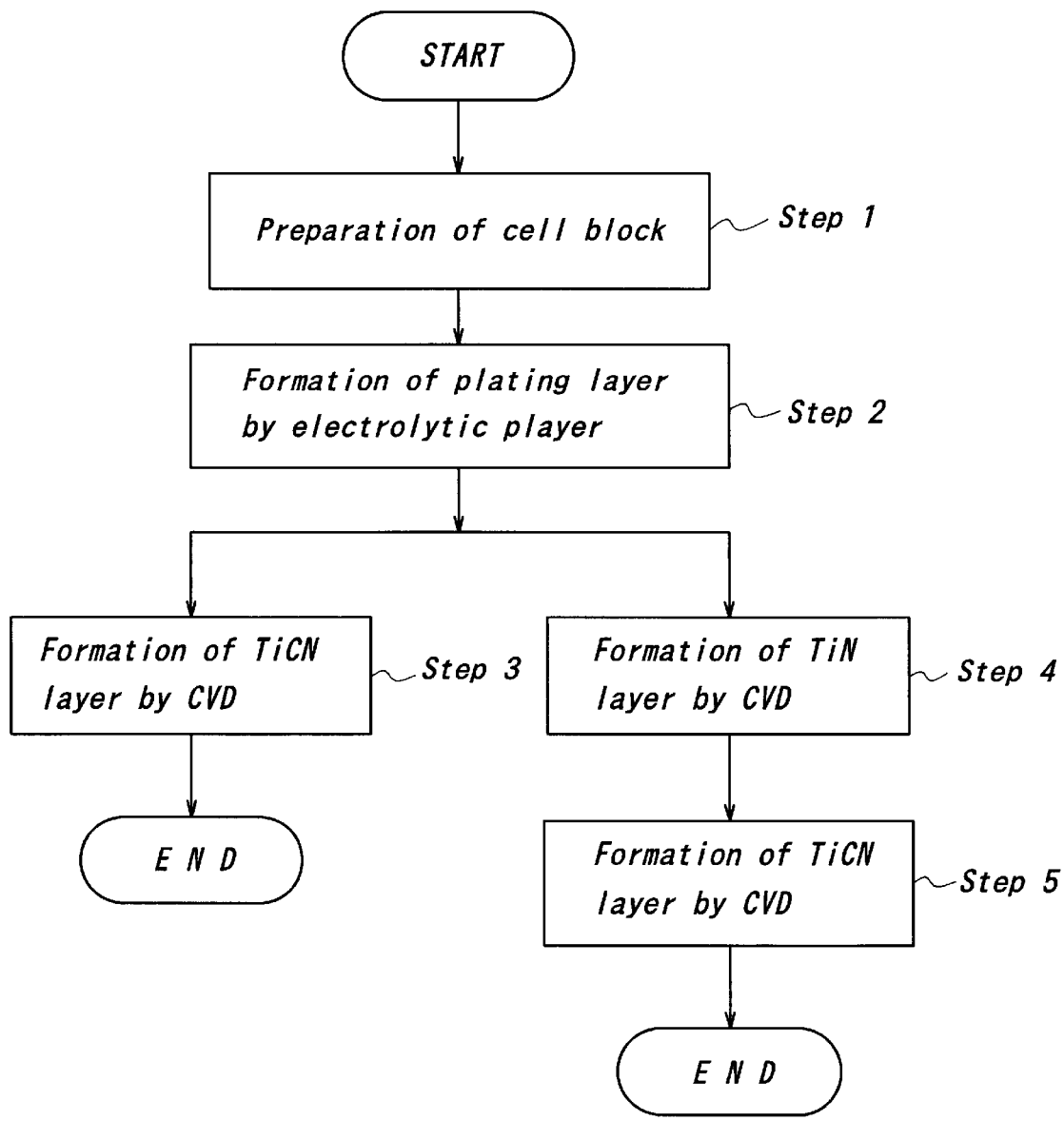
FIG. 1 is a flowchart for explaining a method of manufacturing a honeycomb extrusion die according to the invention.

FIG. 1 is a flowchart for explaining a method of manufacturing a honeycomb extrusion die according to the invention. According to the flowchart shown in FIG. 1, a first aspect and a second aspect of a method of manufacturing a honeycomb extrusion die according to the invention will be explained. At first, in the both embodiments, a die base metal, in which a plurality of intersecting slits are arranged in a front surface thereof and a plurality of raw material feeding holes communicated with the slits are arranged in a back surface thereof, is prepared (step 1). As a material of the die base metal, use may be made of all the materials that are conventionally used for the die base metal. For example, a martensite stainless steel can be preferably used. Moreover, workings of the slits and the raw material feeding holes may be performed by conventional methods. For example, the slits can be formed by EDM (Electro-discharged machining) process and/or wheel grinding process. Further, the raw material feeding holes can be formed by ECM (Electro-chemical machining) process.

Then, a plating layer is formed on the thus prepared die base metal by means of electrolytic plating (step 2). As a material of the plating layer, it is preferred to use Ni, Co or Cu and more preferred to use transition metals that are not easily nitrided or oxidized as compared with Fe or Cr. In this case, since Ni used for electrolytic plating is a pure metal, it is possible to obtain normal TiCN particles. However, since Ni contains a little amount of Co as an impurity at a rate of $1/100$ of Ni, Ni is not a pure metal but an alloy if strictly speaking. Moreover, as a method of forming the plating layer made of Ni by means of electrolytic plating, use may be made of the known methods such as method of using a wood-strike bath, method of using a sulfamic acid bath, method of using a watt bath and method of using an immersion nickel bath. In the case that the plating layer made of metals other than Ni is formed by means of electrolytic plating, electrolytic plating operation can be performed in the substantially same manner as that of Ni by using a bath of cobalt chloride ($CoCl_2$) solution in the case of Co and a bath of copper sulfate ($CuSO_4$) solution in the case of Cu. Further, in the case that a film is directly formed on the die base metal by means of CVD, a composition of the die base metal is limited (that is, in accordance with a composition of the die base metal, the film is formed normally in some cases but the film is not formed in the other cases). However, in the case that the film is formed by electrolytic plating, a composition of the die base metal is not limited (that is, all the compositions of the die base metal are used if only electrolytic plating can be performed on the die base metal). Furthermore, a thickness of the electrolytic plating layer is preferred to be not less than 0.01 $\mu$m. If this thickness is less than 0.01 $\mu$m, nitriding and oxidizing of the die base metal occur, and a contacting performance after forming the film is decreased. Therefore, from a point of view of the contacting performance, this thickness has no upper limit. However, an upper limit of this thickness is determined on the basis of the other conditions such as economical efficiency.

Then, in the first aspect of the invention, a TiCN layer is formed on the electrolytic plating layer by means of CVD (step 3). Moreover, in the second aspect of the invention, a TiN layer is formed on the electrolytic plating layer by means of CVD (step 4), and then a TiCN layer is formed on the TiN layer by means of CVD (step 5). In the both embodiments, since the electrolytic plating layer is arranged, it is possible to achieve an excellent contacting performance with no chipping. In this case, since the TiCN layer limits a material of the electrolytic plating layer by means of CVD to achieve an excellent contacting performance, it is easy to use the second aspect of the invention using the TiN layer, which does not limit a material of the electrolytic plating layer by means of CVD as compared with the TiCN layer.

In the present invention mentioned above, it is possible to improve a contacting performance between the die base metal and the TiCN layer of between the die base metal and the TiN layer by arranging the electrolytic plating layer between the die base metal and the TiCN layer or between the die base metal and the TiN layer. This reason is estimated as follows. That is, in the case that the TiCN layer or the TiN layer is to be formed directly on the die base metal made of stainless steel by means of CVD, since stainless steel has a thin Cr oxide (a few nm) on its surface layer, a contacting performance is reduced due to this Cr oxide. In addition, in the case that the TiN layer and the TiCN layer are formed, $N_2$ (nitrogen) gas is flowed during a TiN layer forming operation. In this case, a nitriding layer (CrN, FeN and so on) is formed due to this $N_2$ gas, and thus this nitriding layer decreases its contacting strength. In the present invention, the electrolytic plating layer made of for example Ni is formed on a surface of the die base metal made of stainless steel, and the TiCN layer or the TiN layer and the TiCN layer is (are) formed on the electrolytic plating layer by means of CVD. Therefore, these phenomena such as a nitriding layer generation do not occur, and thus it is possible to improve the contacting performance between the die base metal and the TiCN layer or between the die base metal and the TiN layer. That is, since Ni is not easily oxidized or nitrided as compared with Cr or Fe, the above advantage can be obtained. Moreover, the transition metals other than Ni, which are not easily nitrided or oxidized as compared with Co, Cu further Fe or Cr, have also the same advantage.

Moreover, in the present invention mentioned above, since the plating layer is made of a metal which shows an excellent stiffness, it is possible to reduce a heat stress between the die base metal and the TiCN layer or the TiN layer. For reference, thermal expansion coefficients of TiCN, TiN, martensite stainless steel, Ni and Co are shown in the following Table 1. As is clearly understood from the thermal expansion coefficients shown in the following Table 1, since, in the present invention, Ni or Co having an intermediate thermal expansion coefficient between those of the die base metal and the film is inserted between the die base metal and the film, it is possible to reduce a heat stress. Moreover, since Ni, Co and so on are a pure metal, they show an excellent stiffness and thus it is possible to absorb a heat stress.

TABLE 1

| Material | Thermal expansion coefficient (/° C.) |
|---|---|
| TiCN | $8.1 \times 10^{-6}$ |
| TiN | $9.3 \times 10^{-6}$ |
| Ni | $16.5 \times 10^{-6}$ |
| Co | $12.0 \times 10^{-6}$ |
| Martensite stainless steel | $19.5 \times 10^{-6}$ |

(At descending temperature from film forming temperature of near 800° C. to room temperature)

Figure 2A:
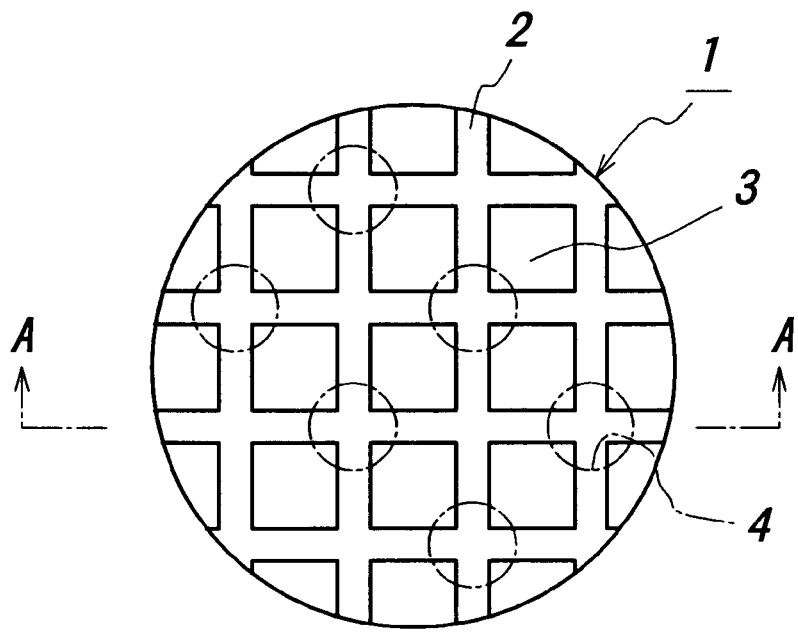
FIGS. 2a and 2b are schematic views respectively showing one embodiment of a honeycomb extrusion die according to the invention.
Figure 2B:
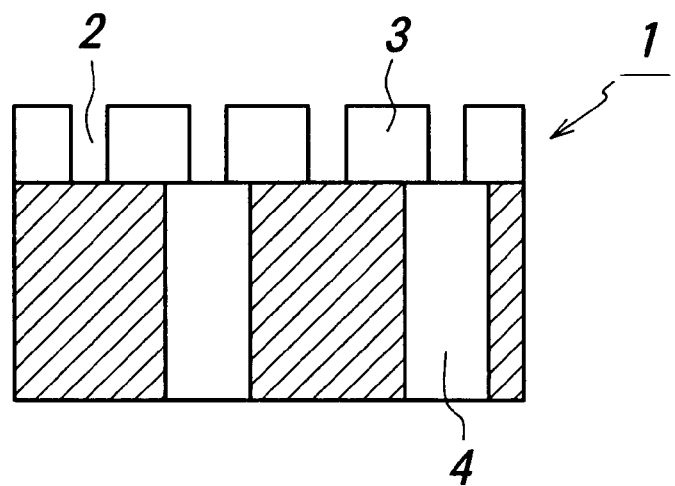
Figure 3:
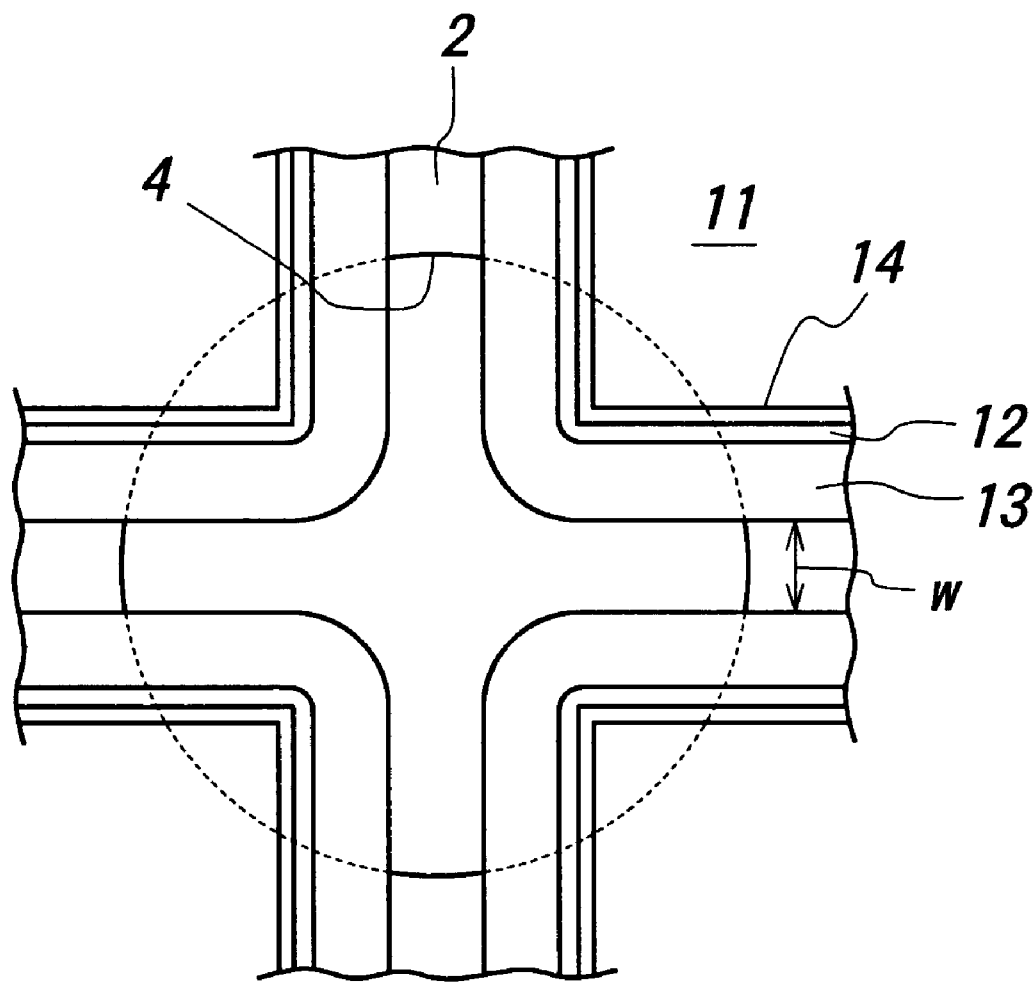
FIG. 3 is a schematic view illustrating an enlarged part of the honeycomb extrusion die according to the invention.

FIG. 2 is a schematic view showing one embodiment of a honeycomb extrusion die according to the invention, wherein FIG. 2a illustrates its plan view and FIG. 2b depicts its cross sectional view along A—A line. In the embodiment shown in FIGS. 2a and 2b, a honeycomb extrusion die 1 is constructed in such a manner that intersecting slits 2 are arranged on its front surface by using a plurality of cell blocks 3 and raw material feeding holes 4 communicated with the slits 2 at its intersecting portion are arranged on its back surface. A batch to be formed is supplied through the raw material feeding holes 4 arranged on its back surface into the die 1, and a honeycomb formed body is extruded from the slits 2 arranged on its front surface. A feature of the honeycomb extrusion die 1 according to the invention is that, as shown in FIG. 3, respective cell blocks 3 comprises a die base metal 11, an electrolytic plating layer 14 arranged on the die base metal 11, a TiN layer 12 arranged on the electrolytic plating layer 14 by means of CVD, and a TiCN layer 13 arranged on the TiN layer 12 by means of CVD. In the case that the TiCN layer 13 is arranged directly on the electrolytic plating layer 14, the TiN layer 12 is not arranged in FIG. 3.

in Table 2 at a temperature of 700–850° C. by means of CVD. In the case of forming the TiN layer and the TiCN layer, a thickness was calculated by their sum. In this manner, the die according to the example of the present invention was manufactured. Moreover, a die according to a comparative example, in which the electrolytic plating layer was not arranged, was also manufactured as shown in Table 2. With respect to the dies according to the example of the present invention and the comparative example, whether the chipping was generated or not and positions at which the chipping was generated were observed. The results were shown in Table 2.

TABLE 2

| | Die base metal | Plating material | Plating method | Plating thickness (μm) | Film kinds | Film thickness (μm) | Chipping state |
|---|---|---|---|---|---|---|---|
| Examples of present invention | Martensite stainless steel | Ni | Wood-strike bath | 0.1 | TiN + TiCN | 10 | No Chipping |
| | Martensite stainless steel | Ni | Wood-strike bath | 0.1 | TiN + TiCN | 20 | No Chipping |
| | Martensite stainless steel | Ni | Wood-strike bath | 0.1 | TiN + TiCN | 30 | No Chipping |
| | Martensite stainless steel | Ni | Wood-strike + sulfamic acid bath | 1 | TiN + TiCN | 25 | No Chipping |
| | Martensite stainless steel | Ni | Wood-strike + sulfamic acid bath | 3 | TiN + TiCN | 25 | No Chipping |
| | Martensite stainless steel | Ni | Wood-strike + sulfamic acid bath | 8 | TiN + TiCN | 25 | No Chipping |
| | Martensite stainless steel | Ni | Wood-strike bath | 0.1 | TiCN | 15 | No Chipping |
| | Martensite stainless steel | Ni | Wood-strike bath | 0.1 | TiCN | 22 | No Chipping |
| | Martensite stainless steel | Co | Bath using $CoCl_2$ solution | 1 | TiN + TiCN | 20 | No Chipping |
| | Martensite stainless steel | Cu | Bath using $CuSO_4$ solution | 1 | TiN + TiCN | 20 | No Chipping |
| Comparative examples | Martensite stainless steel | No plating | No plating | — | TiN + TiCN | 15 | Chipping (R portion) |
| | Martensite stainless steel | No plating | No plating | — | TiN + TiCN | 23 | Chippings (R portion and edge portion) |

Hereinafter, an actual experiment will be explained.

Experiment

Figure 4:
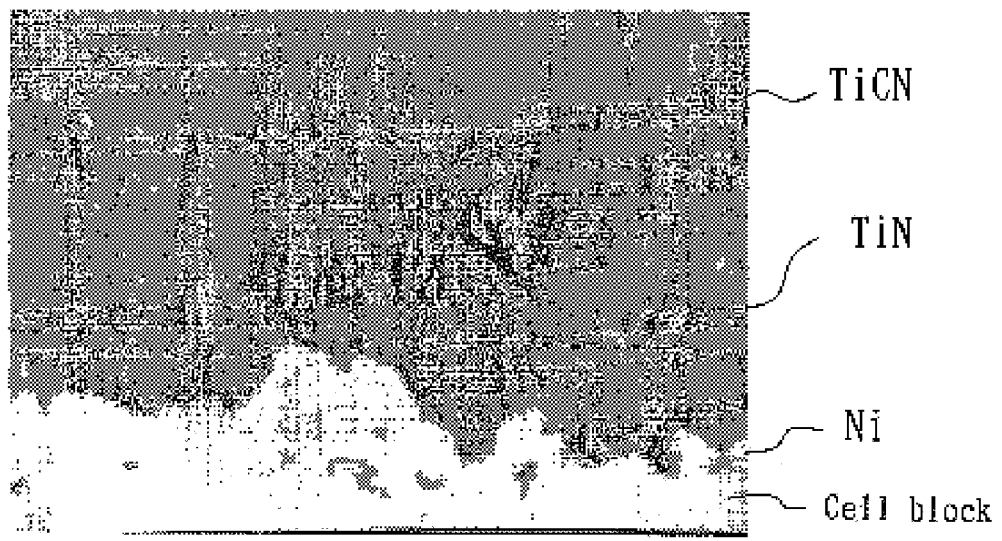
FIG. 4 is a SEM photograph depicting a cross section of the die according to an example of the invention.
Figure 5:
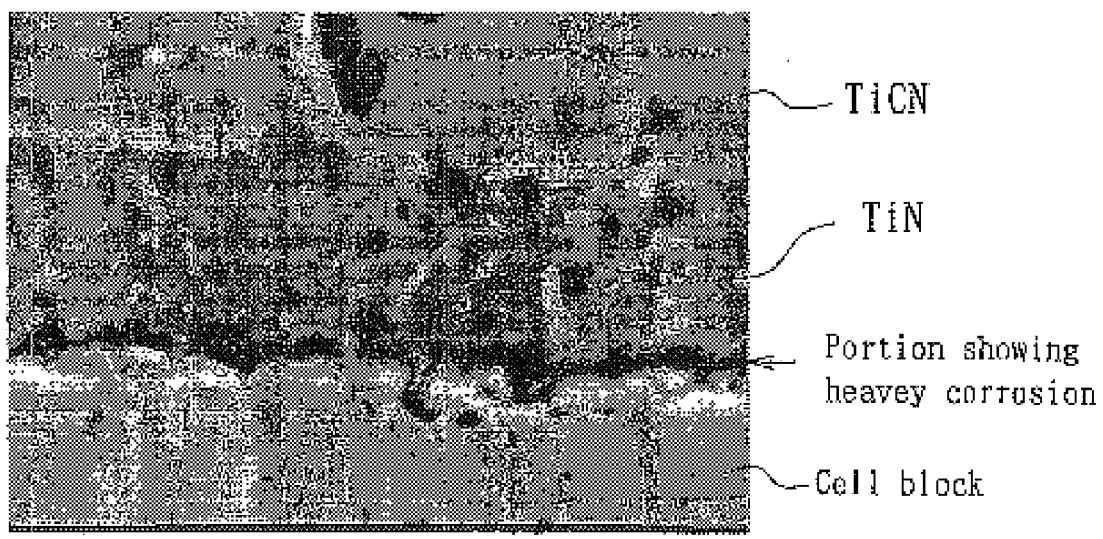
FIG. 5 is a SEM photograph showing a cross section of a die according to a comparative example.
Figure 6:
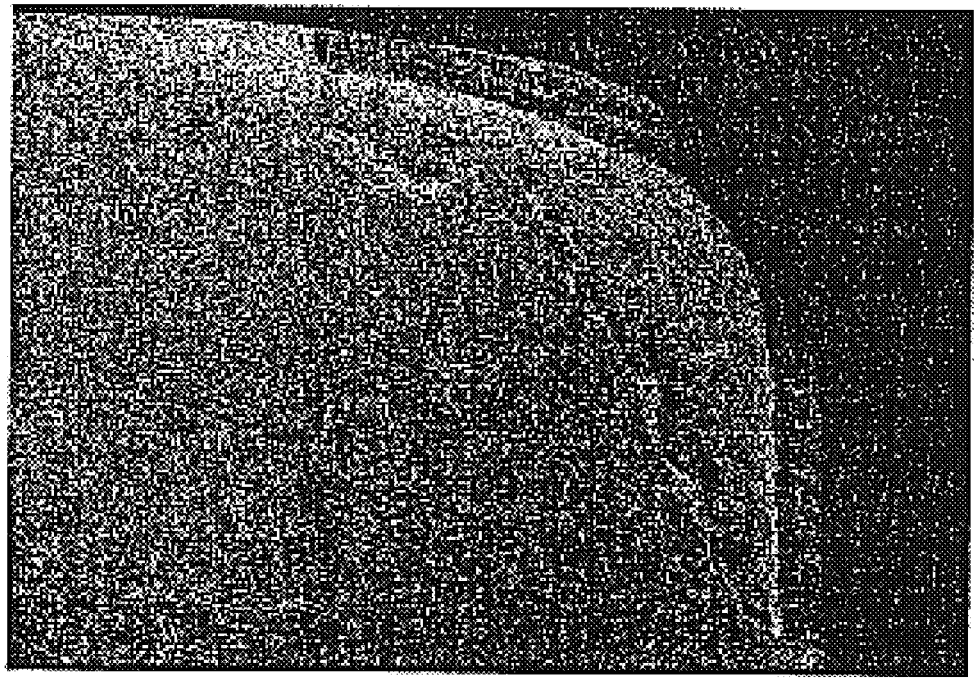
FIG. 6 is a SEM photograph illustrating a chipping state in the comparative example.

As the die base metal, use was made of martensite stainless steel. The slits and the raw material feeding holes were formed to the die base metal by performing ECM process and/or wheel grinding process. Moreover, R portion (formed by electrolytic process) having a round portion was arranged to corners of surfaces of respective die base metals to which the slit was formed. Then, with respect to the die base metal, electrolytic plating process using a material shown in the following Table 2 was performed, and a plating layer having a thickness shown in Table 2 was formed on a die surface. Conditions of electrolytic plating process were pH: not more than 1.5, bath temperature: room temperature and current density: 5–20 A/dm² in the case of wood-strike bath and were pH: 3–5, bath temperature: 20–70° C. and current density: 2–20 A/dm² in the case of sulfamic acid bath, and the experiment was performed according to the plating methods shown in Table 2. Moreover, electrolytic plating conditions of Co were bath temperature: room temperature and current density: 2–20 A/dm², and electrolytic plating conditions of Cu were bath temperature: 20–50° C. and current density: 1–15 A/dm². After that, the single TiCN layer or the TiN layer and the TiCN layer in this order with a thickness shown in Table 2 was (were) formed as shown As clearly understood from the results shown in Table 2, in the example of the present invention, the chipping was not generated, but, in the comparative example, the chipping was generated particularly at the R portions. For reference, a cross sectional photograph after forming the film according to the example of the present invention (die base metal+electrolytic Ni layer+TiN layer+TiCN layer) was shown in FIG. 4, and a cross sectional photograph after forming the film according to the comparative example (die base metal+TiN layer) was shown in FIG. 5. In both cases, a die cut-out cross section was polished and the etched, and then the cross section was observed by the scanning electron microscope (SEM). If the example of the present invention shown in FIG. 4 and the comparative example shown in FIG. 5 are compared, it is understood that, in the example of the present invention shown in FIG. 4, respective layers are contacted strongly, but, in the comparative example shown in FIG. 5, a corroded portion between the die base metal and the TiN layer is shown by black and a failure connection is generated between them. Moreover, FIG. 6 shows a chipping state after forming the film in the comparative example having a film thickness of 15 μm.

As clearly understood from the above explanations, according to the invention, since the electrolytic plating layer is arranged between the die base metal and the TiCN layer or between the die base metal and the TiN layer, a contact property therebetween can be improved, so that the chipping is not easily generated if a thickness of the film is thicker. Moreover, since the plating layer is made of the metal and the metal has an excellent stiffness, it is possible to reduce a heat stress between the die base metal and the TiCN layer or the TiN layer, and thus the chipping is not easily generated. Further, since an impurity in the electrolytic plating layer is very little, it is possible to obtain normal TiCN particles.

What is claimed is:

1. A method of manufacturing a honeycomb extrusion die comprising the steps of:

preparing a die base metal in which a plurality of intersecting slits is arranged in a front surface thereof and a plurality of raw material feeding holes communicated with the slits is arranged in a back surface thereof;

forming a plating layer on the die base metal by means of electrolytic plating; and forming a TiCN layer on the plating layer by means of chemical vapor deposition.

2. The method of manufacturing a honeycomb extrusion die according to claim 1, wherein the plating layer is made of Ni, Co, Cu or transition metals that are not easily nitrided or oxidized.

3. The method of manufacturing a honeycomb extrusion die according to claim 1, wherein a thickness of the plating layer is more than 0.01 $\mu$m.

4. A method of manufacturing a honeycomb extrusion die comprising the steps of:

preparing a die base metal in which a plurality of intersecting slits is arranged in a front surface thereof and a plurality of raw material feeding holes communicated with the slits is arranged in a back surface thereof;

forming a plating layer on the die base metal by means of electrolytic plating;

forming a TIN layer on the plating layer by means of chemical vapor deposition; and forming a TiCN layer on the TiN layer by means of chemical vapor deposition.

5. A die manufactured according to the method of manufacturing a honeycomb extrusion die set forth in claim 4, comprising:

a die base metal having slits and raw material feeding holes;

a plating layer formed on the die base metal;

a TiN layer formed on the plating layer; and a TiCN layer formed on the TiN layer.

* * * * *